(12) United States Patent
Dasnurkar

(10) Patent No.: US 8,106,801 B2
(45) Date of Patent: Jan. 31, 2012

(54) METHODS AND APPARATUS FOR BUILT IN SELF TEST OF ANALOG-TO-DIGITAL CONVERTORS

(75) Inventor: Sachin D Dasnurkar, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/697,435

(22) Filed: Feb. 1, 2010

(65) Prior Publication Data

US 2010/0253559 A1    Oct. 7, 2010

Related U.S. Application Data

(60) Provisional application No. 61/152,166, filed on Feb. 12, 2009.

(51) Int. Cl.
*H03M 1/10* (2006.01)
(52) U.S. Cl. .......................... 341/120; 341/155; 341/169
(58) Field of Classification Search .................. 341/120, 341/155, 169
See application file for complete search history.

(56) References Cited

U.S. PATENT DOCUMENTS

| | | | |
|---|---|---|---|
| 5,132,685 A | 7/1992 | DeWitt et al. | |
| 5,659,312 A | 8/1997 | Sunter et al. | |
| 6,211,803 B1 | 4/2001 | Sunter | |
| 6,259,314 B1 | 7/2001 | Liu et al. | |
| 6,333,706 B1 * | 12/2001 | Cummings et al. | 341/120 |
| 6,518,900 B1 * | 2/2003 | Oehler et al. | 341/120 |
| 6,882,159 B1 | 4/2005 | Cowan et al. | |
| 7,081,841 B1 | 7/2006 | Feist et al. | |
| 7,154,422 B2 * | 12/2006 | Wen | 341/120 |
| 7,158,070 B1 | 1/2007 | Yang et al. | |
| 7,191,373 B2 | 3/2007 | Wang et al. | |
| 7,236,116 B2 | 6/2007 | Hong | |
| 7,271,751 B2 | 9/2007 | Peterson et al. | |
| 7,284,175 B2 | 10/2007 | Wang et al. | |
| 7,379,011 B2 * | 5/2008 | Ham et al. | 341/170 |
| 2002/0138801 A1 | 9/2002 | Wang et al. | |
| 2007/0063885 A1 | 3/2007 | Hong | |
| 2007/0168803 A1 | 7/2007 | Wang et al. | |
| 2007/0182612 A1 | 8/2007 | Peterson et al. | |
| 2008/0125990 A1 | 5/2008 | Chang | |
| 2008/0158028 A1 | 7/2008 | Yang et al. | |

FOREIGN PATENT DOCUMENTS

EP    0 447 117 A2    9/1991
(Continued)

OTHER PUBLICATIONS

B. Provost, E. Sanchez-Sinencio, "On-chip ramp generators for mixed signal BIST and ADC self-test", *IEEE Journal of Solid-State Circuits*, vol. 38, pp. 263-273, 2003.

(Continued)

*Primary Examiner* — Khai M Nguyen
(74) *Attorney, Agent, or Firm* — William M. Hooks

(57) ABSTRACT

An apparatus configured for built in self test (BiST) of analog-to-digital convertors (ADCs) is described. The apparatus includes an ADC to be tested. The apparatus includes a ramp generator. The ramp generator provides a voltage ramp to the ADC. The apparatus further includes feedback circuitry for the ramp generator. The feedback circuitry maintains a constant ramp slope for the ramp generator. The apparatus includes an interval counter. The interval counter provides a timing reference.

40 Claims, 13 Drawing Sheets

FOREIGN PATENT DOCUMENTS

| | | |
|---|---|---|
| EP | 0 447 117 A3 | 9/1991 |
| EP | 0 447 117 B1 | 9/1991 |
| EP | 1 028 557 A2 | 8/2000 |
| EP | 1 364 436 B1 | 5/2006 |
| WO | 01/29970 A2 | 4/2001 |
| WO | 02/071567 A1 | 9/2002 |
| WO | 2007/009912 A1 | 1/2007 |

OTHER PUBLICATIONS

J. L. Huang, C. K. Ong, and K. T. Cheng, "A BIST scheme for on-chip ADC and DAC testing", *Proc. DATE 2000 Paris, France*, pp. 216-220, Mar. 2000.

F. Azas, S. Bernard, Y. Bertrand and M. Renovell, "Towards an ADC BIST Scheme using the Histogram Test Technique", *Proc. European Test Workshop*, pp. 129-134, 2000.

S. Bernard, F. Azas, Y. Bertrand and M. Renovell, "Efficient on-chip generator for linear histogram BIST of ADCs", *Proc. International Mixed-Signal Testing Workshop*, 2001.

F. Azas, S. Bernard, Y. Bertrand, X. Michel and M. Renovell, "A low cost adaptive ramp generator for analog BIST applications", *Proc. VLSI Test Symposium*, 2001.

Bernard, S. and Azais, F. and Bertrand, Y. and Renovell, M., "A High Accuracy Triangle-Wave Signal Generator for On-Chip ADC Testing", *Proceedings of the Seventh IEEE European Test Workshop (ETW 02)*, pp. 1530-1877, 2002.

Erdem S. Erdogan and Sule Ozev, "An ADC-BiST Scheme Using Sequential Code Analysis", *Proceedings of the conference on Design, automation and test in Europe* Nice, France, pp. 713-718, 2007.

* cited by examiner

METHODS AND APPARATUS FOR BUILT IN SELF TEST OF ANALOG-TO-DIGITAL CONVERTORS

RELATED APPLICATIONS

This application is related to and claims priority from U.S. Provisional Patent Application Ser. No. 61/152,166 filed Feb. 12, 2009, for "Methods and Apparatus for Built In Self Test of Analog-To-Digital Convertors," with inventors Sachin D. Dasnurkar and Jacob A. Abraham.

TECHNICAL FIELD

The present disclosure relates generally to electronic devices for communication systems. More specifically, the present disclosure relates to methods and apparatus for built in self test of analog-to-digital convertors.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for testing that can test digital circuits and/or digital systems. Testing may be used to verify or test various parts of devices, such as pieces of hardware, software or a combination of both.

In many cases the equipment used to test a device is a separate piece of equipment than the device being tested. Some testing that takes place is performed substantially by the test equipment. Benefits may be realized by providing improved methods and apparatus for providing built in self tests for electronic devices and/or components used in electronic devices.

DETAILED DESCRIPTION

Figure 1:
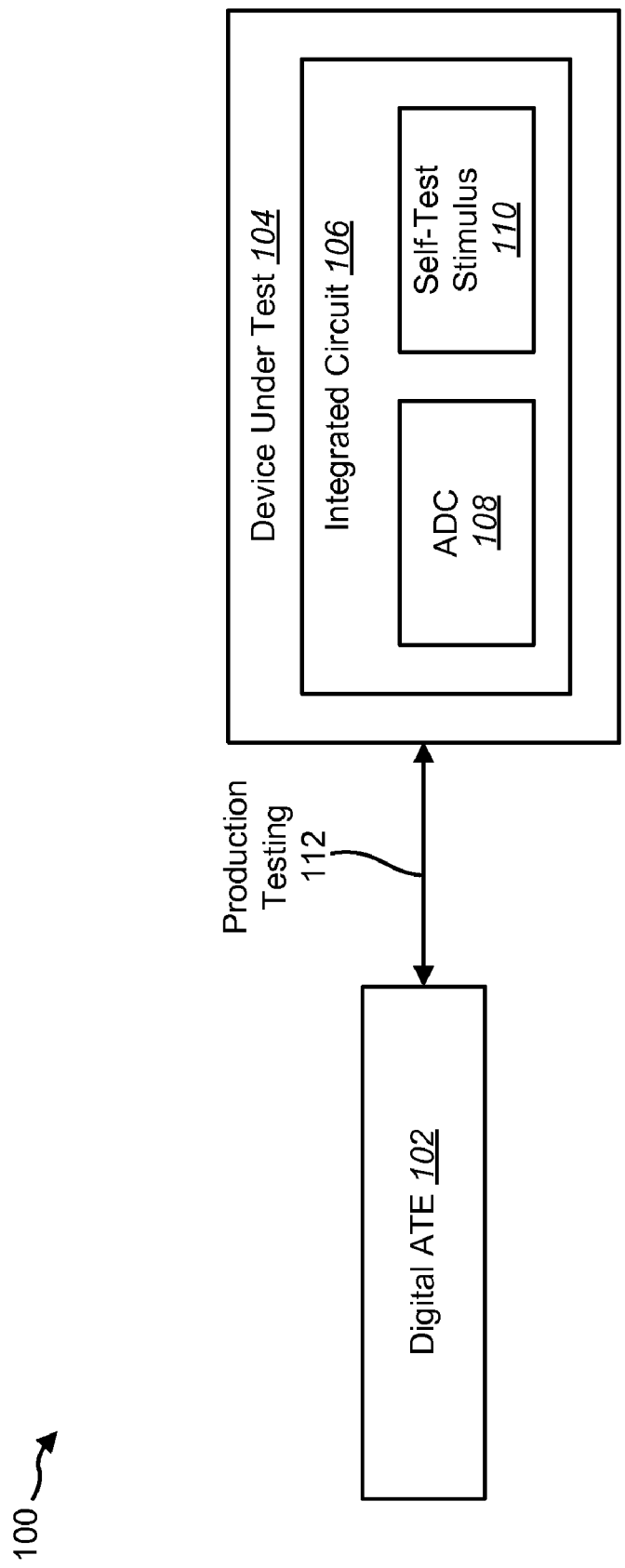
FIG. 1 shows a system for production testing of a device under test (DUT) with mixed signal circuitry.

An integrated circuit configured for built in self test (BiST) of analog-to-digital convertors (ADCs) is disclosed. The integrated circuit includes an ADC and a ramp generator that provides a voltage ramp to the ADC. Feedback circuitry for the ramp generator maintains a constant ramp slope for the ramp generator. An interval counter provides a timing reference.

The ADC, the ramp generator, the feedback circuitry and the interval counter may use the same functional clocks. In one configuration, the ADC, the ramp generator, the feedback circuitry and the interval counter are capable of using phase-shifted limited duty cycle clocks.

The voltage ramp may increase linearly. The feedback circuitry may adjust a gate bias for a transistor in the ramp generator to provide a linearly increasing voltage ramp. The ramp generator may include a current source applied to a capacitor.

Outputs from the ADC may be provided to output pads for observation by automatic test equipment (ATE) using a simple functional pattern. The timing reference may be provided to external ATE.

The feedback circuitry may include a clocked comparator. The clocked comparator may output a supply voltage if the voltage ramp is less than half the supply voltage at half the ramp period. In addition, the clocked comparator may output a voltage of zero volts if the voltage ramp is greater than half the supply voltage at half the ramp period.

The integrated circuit may also include a multiplexer. The multiplexer may switch an input for the ADC between operational analog inputs and the voltage ramp.

The interval counter may be scannable and the output may be shifted out serially for production testing by ATE. The interval counter may receive outputs from the ADC.

A method for BiST of ADCs is also described. A constant current is generated. A voltage ramp is provided by a ramp generator. Feedback is provided to the ramp generator. The voltage ramp from the ramp generator is applied to an ADC.

A wireless device configured for BiST of ADCs is also disclosed. The wireless device includes a processor, memory in electronic communication with the processor, a transceiver, and circuitry that includes an ADC, a ramp generator and feedback circuitry. The ramp generator provides a voltage ramp to the ADC. The feedback circuitry for the ramp generator maintains a constant ramp slope for the ramp generator. The wireless device also includes an interval counter that provides a timing reference.

An apparatus for BiST of ADCs is also described. The apparatus includes means for generating a constant current and means for providing a voltage ramp by a ramp generator. The apparatus also includes means for providing feedback to the ramp generator and means for applying the voltage ramp from the ramp generator to an ADC.

A computer-program product for a wireless device configured for BiST of ADCs is also disclosed. The computer-program product includes a computer-readable medium having instructions thereon. The instructions include code for generating a constant current and code for providing a voltage ramp by a ramp generator. The instructions further include code for providing feedback to the ramp generator and code for applying the voltage ramp from the ramp generator to an ADC.

Many different kinds of electronic devices may benefit from testing. Different kinds of such device include, but are not limited to, cellular telephones, wireless modems, computers, digital music players, Global Positioning System units, Personal Digital Assistants, gaming devices. Etc. One group of devices includes those that may be used with wireless communication systems. As used herein, the term "mobile station" refers to an electronic device that may be used for voice and/or data communication over a wireless communication network. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc.

A wireless communication network may provide communication for a number of mobile stations, each of which may be serviced by a base station. A base station may alternatively be referred to as an access point, a Node B, or some other terminology.

Base stations and mobile stations may make use of integrated circuits with mixed signal circuitry. Production of integrated circuits may result in process variations that affect the operation of the mixed signal circuitry. Production testing of integrated circuits with mixed signal circuitry may ensure the proper operation of the integrated circuits. Production testing of integrated circuits with mixed signal circuitry may require an input test stimulus; however, low cost ATE such as a purely-digital ATE may be unable to provide an input test stimulus externally. External analog stimulus generation requires complex analog/radio frequency (RF) compatible ATE with the associated high cost. An on-chip stimulus generation scheme with optimized silicon overhead may provide the necessary input test stimulus for testing of an integrated circuit with mixed signal circuitry using a low-cost ATE.

FIG. 1 shows a system 100 for production testing 112 of a DUT 104 with mixed signal circuitry. In one configuration, the DUT 104 may be a wireless device such as a mobile station or a base station. Alternatively, the DUT 104 may be a chip for use in a wireless device. In other configurations, the DUT 104 may not be a wireless device or part of a wireless device. The DUT 104 may include an integrated circuit 106. The integrated circuit 106 may include mixed signal circuitry. Mixed signal circuitry may be circuitry that includes both analog and digital circuitry. In one configuration, the integrated circuit 106 may include an analog to digital convertor (ADC) 108. The ADC 108 may convert an analog signal into a digital signal, thus the ADC 108 may include both analog circuitry and digital circuitry.

The cost of testing mixed signal circuitry with a conventional analog-stimulus may be much higher than the cost of testing digital circuitry due to the higher cost of ATE required for analog stimulus generation. Multiple variants of low cost testers have been developed for digital testing which rely on relaxed timing, power or tester channel requirements to lower hardware costs. Digital ATE 102 may be unable to test integrated circuits 106 including mixed-signal/RF components due to the limitations of such ATE 102: the lack of analog/RF stimulus and measurement modules. Analog blocks are increasingly common on digital Application Specific Integrated Circuits (ASICs), System on a Chip (SoC) and System in a Package (SiP) modules.

A digital ATE 102 may enable full production-quality testing 112 of integrated circuits 106 that include ADCs 108 by using a hybrid Built in Self Testing (BiST) scheme. One factor for using a low cost ATE such as a digital ATE 102 to test mixed signal integrated circuits 106 is an on-chip generated self-test stimulus 110. The self-test stimulus 110 may generate an input or signal for testing purposes. A low-cost ATE may be unable to provide a test stimulus externally. A self-test stimulus 110 may provide a ramp input with a well characterized linear slope for complete testing of the ADC 108. The ramp input with a well characterized linear slope may be used for production testing 112 of an ADC 108 by a digital ATE 102 with a real-time code analysis method.

Ramp generation schemes requiring a negative voltage supply on the DUT 104 for process variation testing may be used. However, a negative voltage supply on the DUT 104 is rare for modern SoC and SiP systems. An integrated circuit 106 with a self-test stimulus 110 may be production tested 112 without the need of additional positive or negative power supplies, other than the native supplies for the ADC 108 and buffers.

Figure 2:
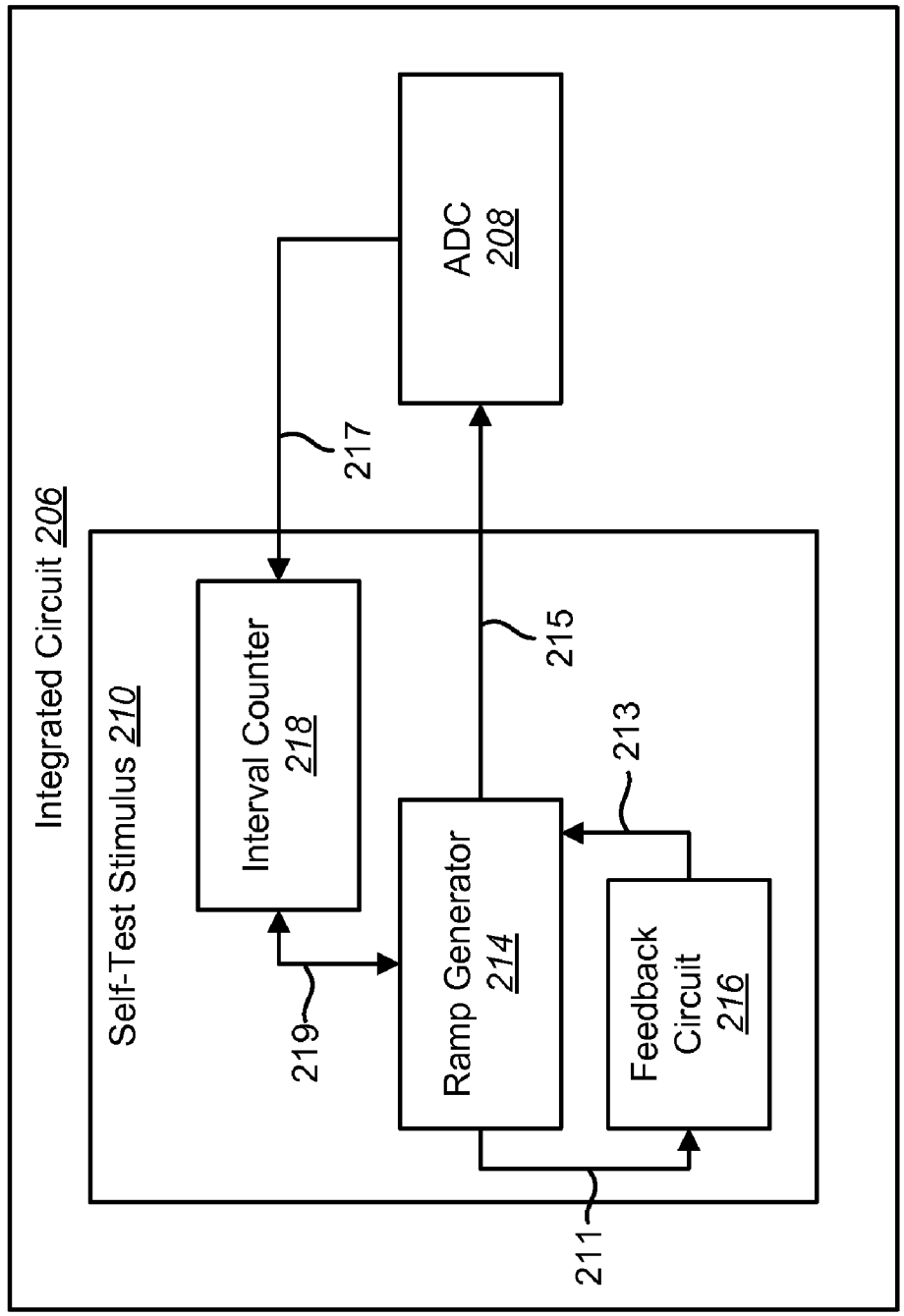
FIG. 2 is a block diagram illustrating various components of an integrated circuit with an input test stimulus.

FIG. 2 is a block diagram illustrating various components of one configuration of an integrated circuit 206 with a self-test stimulus 210. The integrated circuit 206 of FIG. 2 may be one example of the integrated circuit 106 of FIG. 1. The integrated circuit 206 may include an ADC 208. The integrated circuit 206 may also include a self-test stimulus 210. The self-test stimulus 210 may include a ramp generator 214. A basic ramp generator 214 may include a constant current source feeding a capacitor serially. For the ADC 208 to have a constant-slope-constant-period ramp as an input 215, an accurate constant current source and an accurate capacitance value for the capacitor may be needed. Process variations for the integrated circuit 206 may affect the ramp slope and ramp linearity thereby making the self-test stimulus 210 of limited use for production testing 112.

The charging of a load capacitor (not shown in FIG. 2) in the ramp generator 214 by a constant current source in the ramp generator 214 may linearly increase the voltage across the plates of the load capacitor. The voltage across the plates of the load capacitor may be referred to as the ramp voltage or $V_{ramp}$. Any process variation that causes a change in the capacitance of the capacitor may inversely affect the ramp voltage slope. Similarly, any process variation that causes a change in the current drive of the ramp generator 214 may affect the charging time of the load capacitor. For example, if the input swing specification for the ADC 208 is 0 volts (V) to VDD (supply voltage), the input ramp 215 for the ADC 208 should reach VDD at a time period t' for each cycle. Process variations may affect this time period, slope and linearity.

Without feedback, a very precise process target may be required for the ramp generator 214 to maintain the required ramp slope. A ramp generator feedback circuit 216 may provide controllability of the ramp generator 214. The ramp generator feedback circuit 216 may maintain a substantially constant voltage ramp slope for process variations in the capacitor and/or constant current source. The ramp generator feedback circuit 216 may be dynamic to ensure process corner independence. The ramp generator feedback circuit 216 may receive $V_{ramp}$ 211 from the ramp generator 214 and return feedback 213 to the ramp generator 214.

The self-test stimulus 210 may also include an interval counter 218. A digital counter, using in-phase clock resources as the ramp generator 214 discussed above, may be used as the interval counter 218 in the BiST scheme. The interval counter 218 may act as an accurate approximation of the ramp generator 214 because the interval counter 218 and the ramp generator 214 share clocking resources. The interval counter 218 may be added to the BiST scheme to provide a timing reference. The code-width of the interval counter 218 may be optimized to provide an adequate number of timing references without excessive silicon or timing overhead. The interval counter may receive the output 217 of the ADC 208. The interval counter 218 and the ramp generator may share 219 a clock resource.

Figure 3:
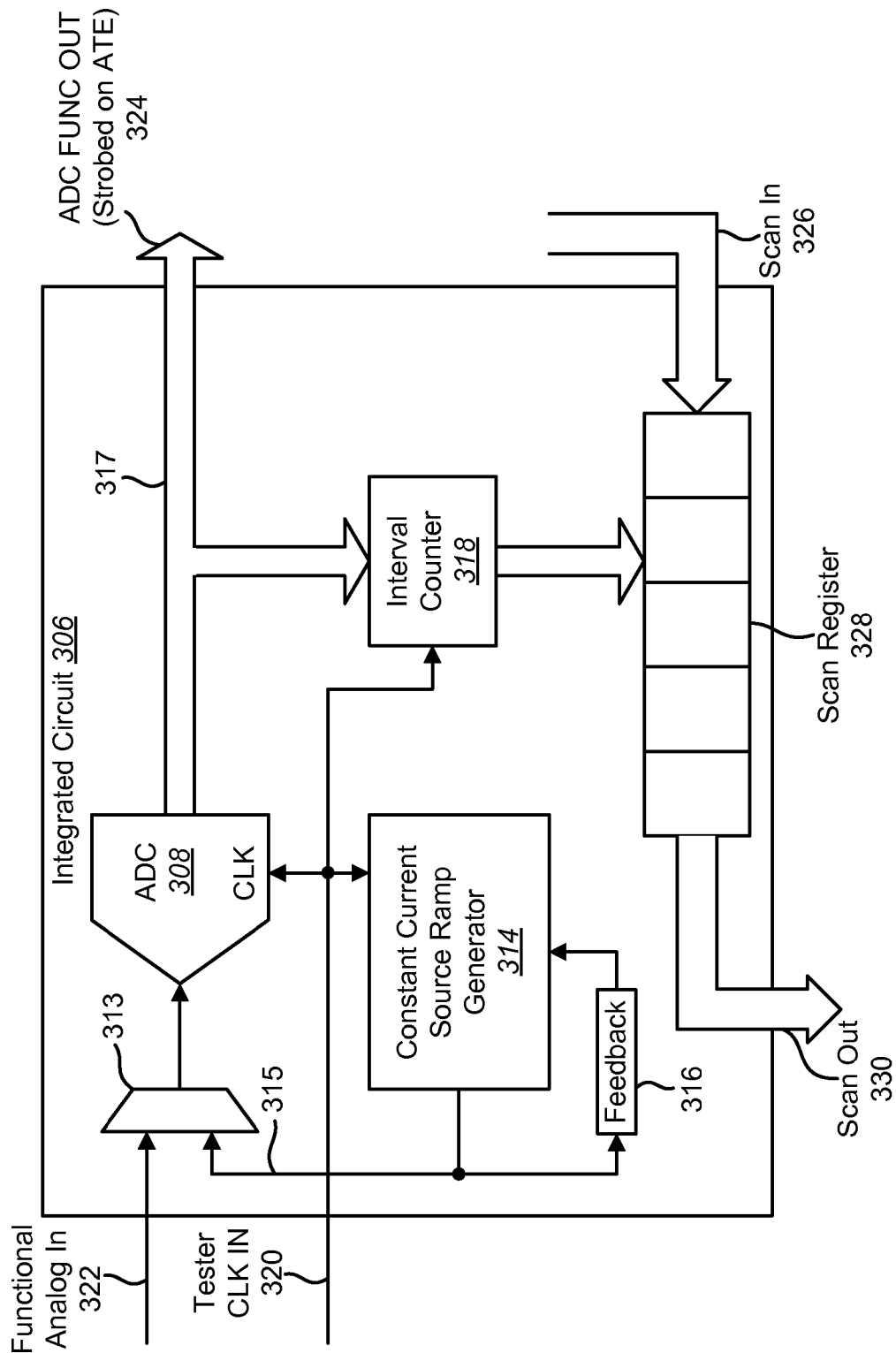
FIG. 3 is a block diagram illustrating an integrated circuit with a built in self test (BiST) scheme for an analog to digital converter (ADC)

FIG. 3 is a block diagram illustrating an integrated circuit 306 with a built in self test (BiST) scheme for an ADC 308. The integrated circuit 306 of FIG. 3 may be one example of the integrated circuit 106 of FIG. 1. The BiST scheme may be designed to use a minimal area overhead, to operate in the absence of a negative power supply, to operate without additional clock requirements, and to have an optimized settling time. The integrated circuit 306 may include a constant current source ramp generator 314. The constant current source ramp generator 314 of FIG. 3 may be one example of the ramp generator 214 of FIG. 2. The constant current source ramp generator 314 is discussed in further detail below in relation to FIG. 6. The constant current source ramp generator 314 may provide the ADC 308 with a constant ramp slope. The constant ramp slope may increase linearly. The use of the term constant herein means substantially constant, and is not used to mean strictly and exactly constant. A multiplexer 313 may switch the input for the ADC 308 from the operational analog inputs Functional Analog In 322 to the ramp output 315 output from the constant current source ramp generator 314.

A hybrid feedback mechanism 316 between the ramp output 315 and the generator 314 may maintain a constant ramp slope for the constant current source ramp generator 314. The hybrid feedback mechanism 316 is discussed in further detail below in relation to FIG. 7. The hybrid feedback mechanism 316 may optimize the settling time of the constant current source ramp generator 314. The nominal transistor widths of the hybrid feedback mechanism 316 may be adjusted such that the voltage of the constant ramp slope output 315 of the constant current source ramp generator 314 may settle to $V_{max}$ in approximately 10 cycles. $V_{max}$ is the maximum output voltage 315 that the constant current source ramp generator 314 will output. The hybrid feedback mechanism 316 may ensure a dynamic process-corner-independent stable operation providing positive or negative feedback, depending on the results from the previous cycle.

The integrated circuit 306 may also include an interval counter 318. The interval counter 318 of FIG. 3 may be one example of the interval counter 218 of FIG. 2. The interval counter 318 may receive the output of the ADC 308. The interval counter 318 may provide a timing reference to external testing equipment such as a digital ATE 102. In the BiST scheme of FIG. 3, a 4-bit counter is shown with a scannable output 330, effectively providing one timing anchor for 8-bits of ADC output 317 codes. The interval counter 318 may be shifted out of a scannable register 328 and may be used for characterization calculations. The interval counter 318 may indicate the estimated instantaneous input stimulus value which is used to perform accurate integral non linearity (INL)/differential non linearity (DNL) calculations on an ATE with limited computing resources.

INL calculations represent the maximum deviation between the ideal output of an ADC 308 and the actual output 317. DNL calculations represent the deviation between two adjacent paths. For example, when testing an ADC 308, the digital value may ramp smoothly as the input is linearly swept across the entire range. DNL may measure the deviation from the ideal for the output 317 digital value of the ADC 308. INL may measure the maximum deviation from the ideal for the output 317 digital value of the ADC 308. Increasing the interval counter 318 width may provide additional timing anchors, effectively resulting in more accurate DNL calculations at the cost of timing overheads.

The interval counter may be scannable 326 and the output 330 may be shifted out serially to the ATE for DNL calculations. The term scan refers to serial shifting of data into or out of the DUT 104 using a clocked register scheme. The data may be fed into the scan register serially or in parallel but can only be shifted out to the ATE in a serial manner. Using a 12-bit interval counter 318 for a 12-bit ADC 308 may reduce the computational requirements as well as the calculation errors. However, the area overhead of a 12-bit interval counter 318 is comparable to the actual area of the ADC 308 and hence is equally likely to be affected by a fabrication fault.

In one configuration, a low cost ATE 102 may provide a free-running clock 320 at frequencies in excess of 750 megahertz (MHz). But, the synchronous data operations of the ATE 102 may be limited to 25 MHz, which may limit the maximum scan out 330 data frequency of the interval counter 318. A 4-bit counter may also be useful for any future work done in the area of code-offset testing of embedded ADCs 308.

A single positive supply with a total of two differential clocks 320 may be used for all the components of the integrated circuit 306, including the ADC 308, the constant current source ramp generator 314, the hybrid feedback mechanism 316, and the interval counter 318. The clock source 320 may be referred to as Tester CLK IN 320. The use of multiple clocks may limit multi-site production testing. Furthermore, a low-cost ATE 102 may have a limited number of clocking resources available. To maintain low-cost ATE 102 compatibility, the components on the integrated circuit 306 may need to use clocks 320 with a 50 percent duty cycle. The high speed asynchronous clocks available on low-cost ATE 102 may be free running phase locked loop (PLL) outputs. A 50 percent duty cycle PLL-generated clock 320 may be produced on most low-cost ATE 102 at the required high frequencies. Using phase-shifted limited duty cycle clocks may require greater system resources and may not be within the capabilities of a typical low-cost ATE 102.

A hybrid BiST scheme may use a real-time code analysis method. In a hybrid BiST scheme, the ADC output 317 may be directed to output pads and observed using a simple functional pattern 324. A full scannable scheme may require the entire code width to be output and scanned out at-speed, which may not be feasible for a typical low-cost ATE 102. A full scannable scheme may also require all the data and the overhead bits to be shifted serially, increasing the frequency requirements of the ATE 102. For an n-bit code width ADC 308 rated as $f_{operational}$ the required synchronous data transfer rate ($R_{sync}$) may be calculated using Equation (1):

$$R_{sync} = f_{opr} \times W_{code} + f_{opr} \times W_{int\text{-}counter} + T_{overhead}. \quad (1)$$

In Equation (1), $f_{opr}$ is the frequency of operation of the ADC 308 and BiST scheme. $W_{code}$ is the code width of the ADC 308, which specifies the bit-width of the ADC 308. $W_{int\text{-}counter}$ is the code width of the interval counter 318, which specifies the bit-width of the interval counter 318 used in the BiST scheme. $T_{overhead}$ is the timing overhead added due to delays in the BiST scheme.

A typical 12-bit ADC 308 with sampling at 25 megahertz (MHz) with a 4-bit interval counter may result in a synchronous scan requirement of 400 MHz, which is significantly higher than the 25 MHz scan limit. Such a high frequency requirement in the digital block may also cause strict timing closure requirements. Running the ADC 308 slower than the rated speed may result in production test quality issues and it may limit the data scan rates within the ATE 102 data rate. This may be applicable to SoC or SiP systems where the ADC output 317 is accessible either as dedicated outputs or muxed in a test mode. The overall error factor $N_{total}$ due to added noise may be calculated using Equation (2):

$$N_{total} = N_{ADC\text{-}inherent} + N_{ramp\text{-}stimulus} + N_{system}. \quad (2)$$

In Equation (2), $N_{ADC\text{-}inherent}$ is the inherent noise present in an ADC 308 without any BiST circuit additions. $N_{ramp\_stimulus}$ is the noise added due to the ramp generator 314. $N_{ramp\_stimulus}$ may be due to the ramp signal non-idealities as well as circuit component related noise. $N_{system}$ is the noise added due to system non-idealities. $N_{system}$ may include clocking as well as component related noise.

The inherent ADC 308 values may be assumed to be unchanged in a BiST scheme. Providing an internal stimulus and observing the digital output nodes may ensure that the $N_{ADC\text{-}inherent}$ estimate is very close to the ADC 308 intrinsic error. Factors $N_{ramp\text{-}stimulus}$ and $N_{system}$ may encounter catastrophic errors in case of fabrication issues but any such catastrophic errors would be easily detected by observing the ADC outputs 317 with a functional pattern 324.

The addition circuitry including the interval counter 318 and the scan register 328 are digital in nature and may not be affected by any noise, as long as clean clocks 320 are used to drive the blocks and setup/hold constraints are maintained. The majority of injected noise may thus come out of the component $N_{ramp\text{-}stimulus}$ due to the constant current source ramp generator 314. The ramp generator error may be further classified into two components, waveform inherent errors in the form of INL and DNL and noise added due to the feedback mechanism. Switching noise added by the voltage feedback scheme may be added to the ramp voltage peak noise. The feedback transmission gate width may be optimized to ensure that the ramp peak noise present is within acceptable limits using Equation (3):

$$N_{total} = \int_0^T [N_{INL} + N_{DNL} + N_{Ramp\text{-}Slope}] \quad (3)$$

In Equation (3), $N_{INL}$ is the noise added due to INL effects in the ADC output 317, as compared to an ideal ADC output. $N_{DNL}$ is the noise added due to DNL effects in the ADC output 317, as compared to an ideal ADC output. $N_{Ramp\text{-}Slope}$ is the noise added due to the non-idealities of the generated ramp waveform as compared to an ideal ramp waveform. $N_{Ramp\text{-}Slope}$ may be calculated using Equation (4):

$$N_{Ramp\text{-}Slope} = f[\text{fab-corner, Transistor } W/L, C_{out}]. \quad (4)$$

In Equation (4), fab-corner is the fabrication corner, indicating the exact process corner where the DUT 104 lies. Transistor W/L is the width to length ratio of the transistors used in the BiST mechanism. $C_{out}$ is the capacitance of the output load capacitor used for generating the ramp stimulus.

In production testing, the ADC 308 test may be a test mode which can run concurrently along with tests due to the ADC 308 test resource independence. An initialization signal may be provided to the ramp generator 314 by the test mode control block (not shown). The functional clocks 320 may be gated to the ADC 308 as well as the ramp generator 314 and interval counter 318 blocks. A functional pattern 324 may be used for observing the interval counter 318 as well as the ADC outputs 317. The functional pattern 324 observing these nodes may be designed for performing Bit Error Rate (BER) calculations to observe INL and DNL errors.

Figure 4:
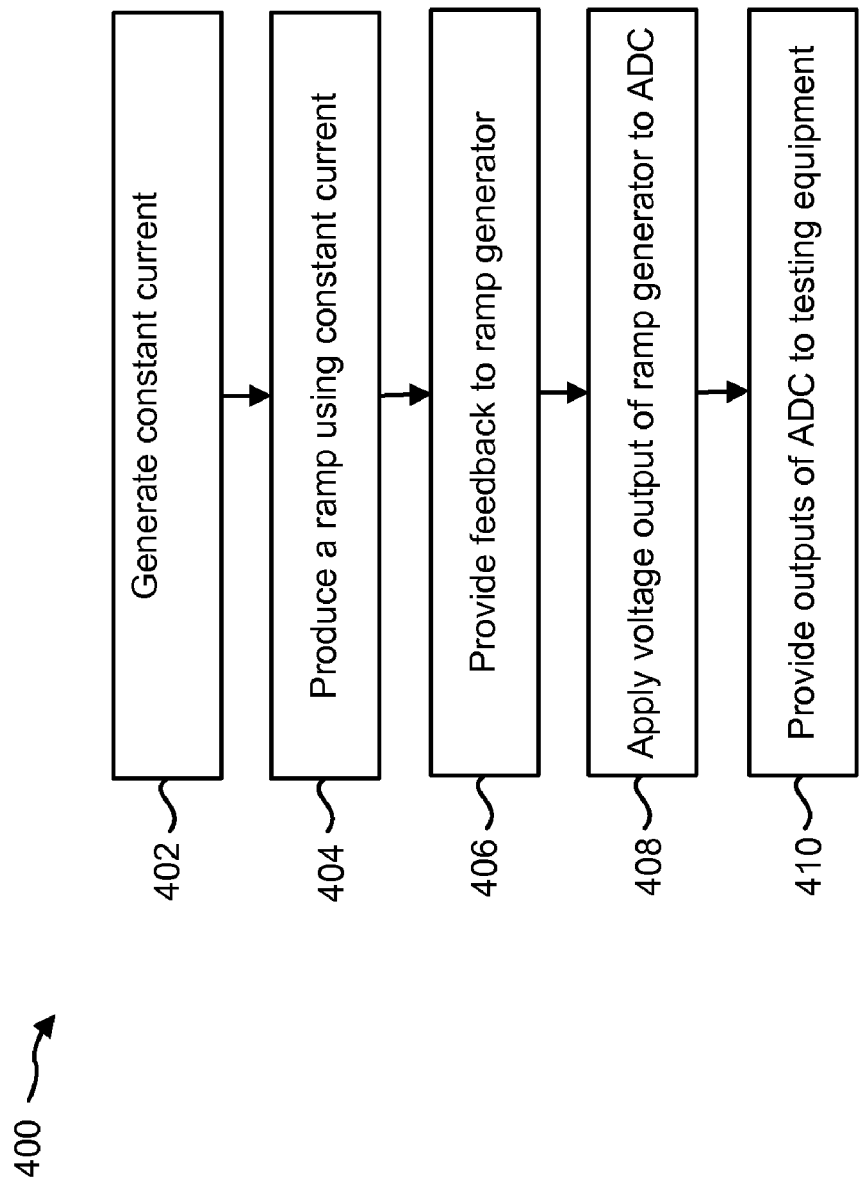
FIG. 4 is a flow diagram illustrating a method for BiST of ADCs with low-cost automatic test equipment (ATE) compatibility.

FIG. 4 is a flow diagram illustrating a method 400 for BiST of ADCs 108 with low-cost automatic test equipment (ATE) 102 compatibility. An ADC 108 may be part of an integrated circuit 106. A constant current source on the integrated circuit 106 may generate 402 a constant current. The constant current source may then produce 404 a ramp. The constant current source may produce 404 a ramp (e.g., ramp generator 214) by feeding the constant current to a capacitor. A feedback circuit 216 may provide 406 feedback to the ramp generator 214.

The ramp generator 214 may produce a voltage output 215. The ramp generator 214 may apply 408 the voltage output 215 to the ADC 108. For example, the voltage output 215 may provide an analog signal to the ADC 108. The ADC 108 may then output a digital signal 217. The ADC 108 may provide 410 the outputs 217 of the ADC 108 to testing equipment. For example, the ADC 108 may provide 410 the outputs 217 of the ADC 108 to a digital ATE 102. The outputs 217 of the ADC 108 may facilitate production testing 112 of the ADC 108 by a low-cost ATE 102.

Figure 4A:
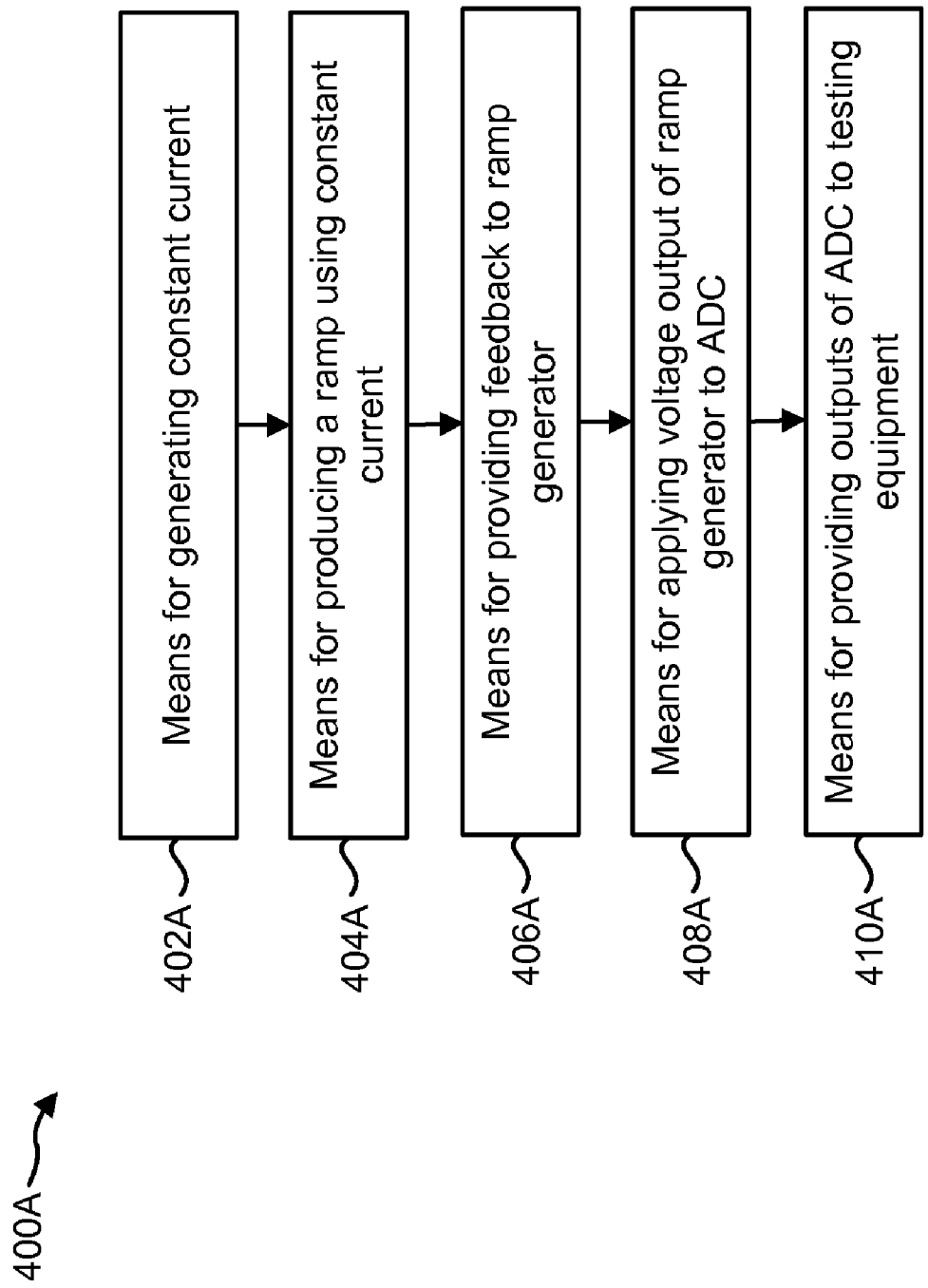
FIG. 4A illustrates means-plus-function blocks corresponding to the method of FIG. 4.

The method 400 of FIG. 4 described above may be performed by various hardware and/or software component(s) and/or module(s) corresponding to the means-plus-function blocks 400A illustrated in FIG. 4A. In other words, blocks 402 through 410 illustrated in FIG. 4 correspond to means-plus-function blocks 402A through 410A illustrated in FIG. 4A.

Figure 5:
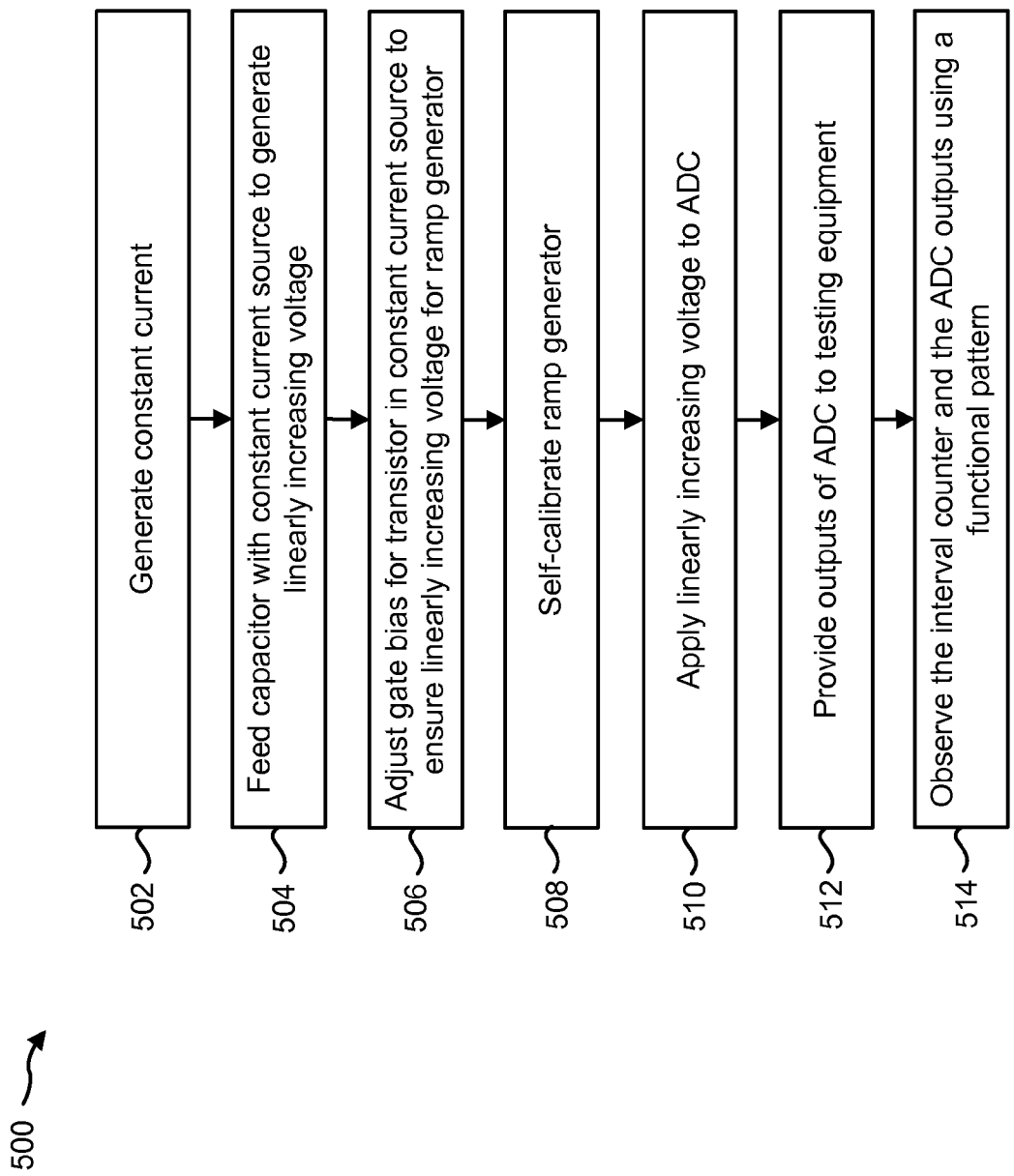
FIG. 5 is a flow diagram illustrating another method for BiST of ADCs with low-cost ATE compatibility.

FIG. 5 is a flow diagram illustrating another method 500 for BiST of ADCs 108 with low-cost ATE 102 compatibility. An ADC 108 may be part of an integrated circuit 106. Production testing 112 of the ADC 108 may be necessary or desired. A constant current source on the integrated circuit 106 may generate 502 a constant current. The constant current source may feed 504 a capacitor with the constant current to generate a linearly increasing voltage 215 as a ramp generator 214. A feedback circuit 216 may adjust 506 the gate bias for a transistor in the constant current source to ensure a linearly increasing voltage 215 for the ramp generator 214.

An interval counter 218 on the integrated circuit 106 may self-calibrate 508 the ramp generator 214. The ramp generator 214 may apply 510 the linearly increasing voltage 215 to the ADC 108 and the ADC 108 may output 317 a digital signal. The ADC 108 may provide 512 the outputs 317 of the ADC 108 to testing equipment such as a low-cost ATE 102. The testing equipment may then observe 514 the interval counter 218 and the output 317 of the ADC 108 using a functional pattern 324.

Figure 5A:
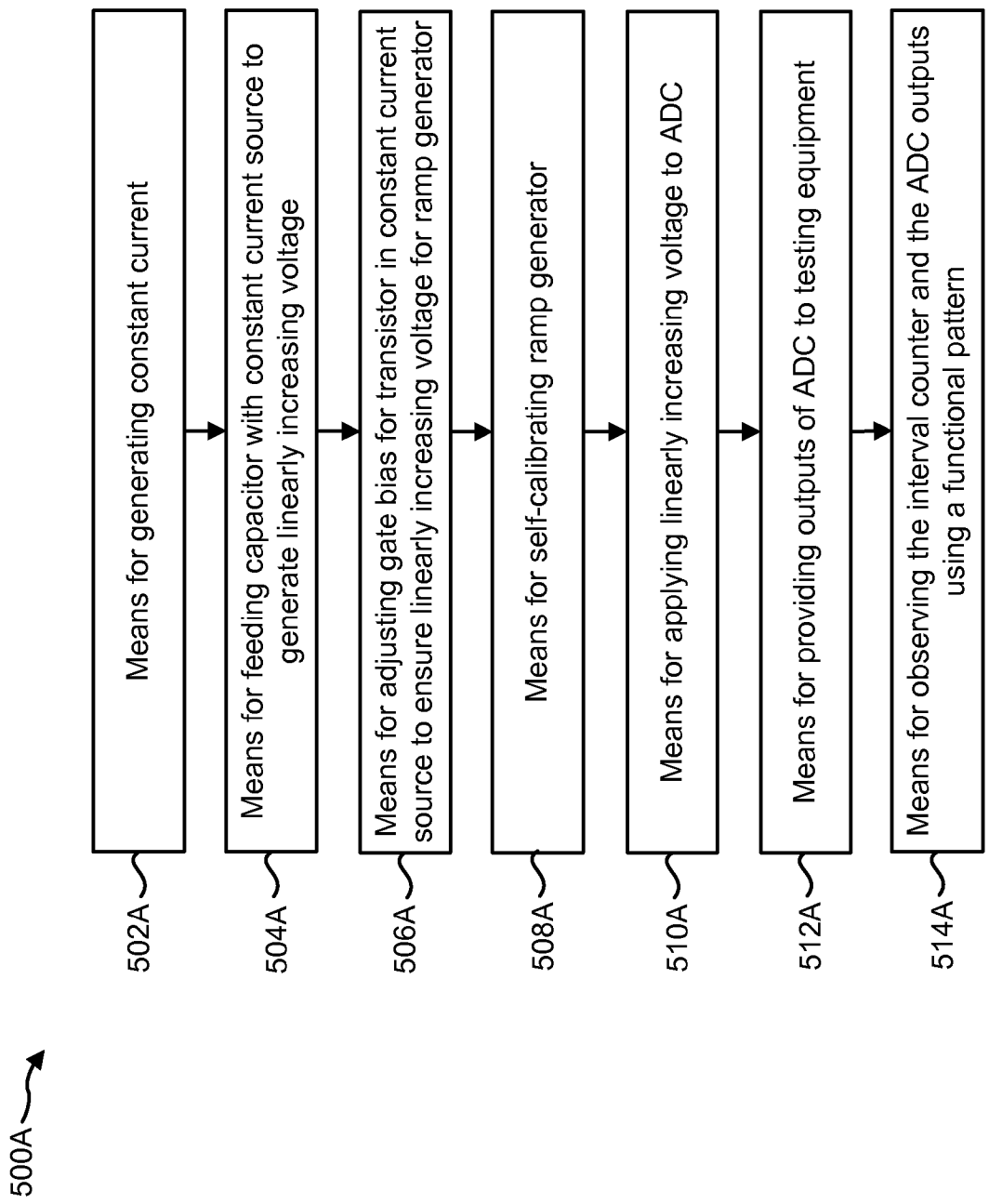
FIG. 5A illustrates means-plus-function blocks corresponding to the method of FIG. 5.

The method 500 of FIG. 5 described above may be performed by various hardware and/or software component(s) and/or module(s) corresponding to the means-plus-function blocks 500A illustrated in FIG. 5A. In other words, blocks 502 through 514 illustrated in FIG. 5 correspond to means-plus-function blocks 502A through 514A illustrated in FIG. 5A.

Figure 6:
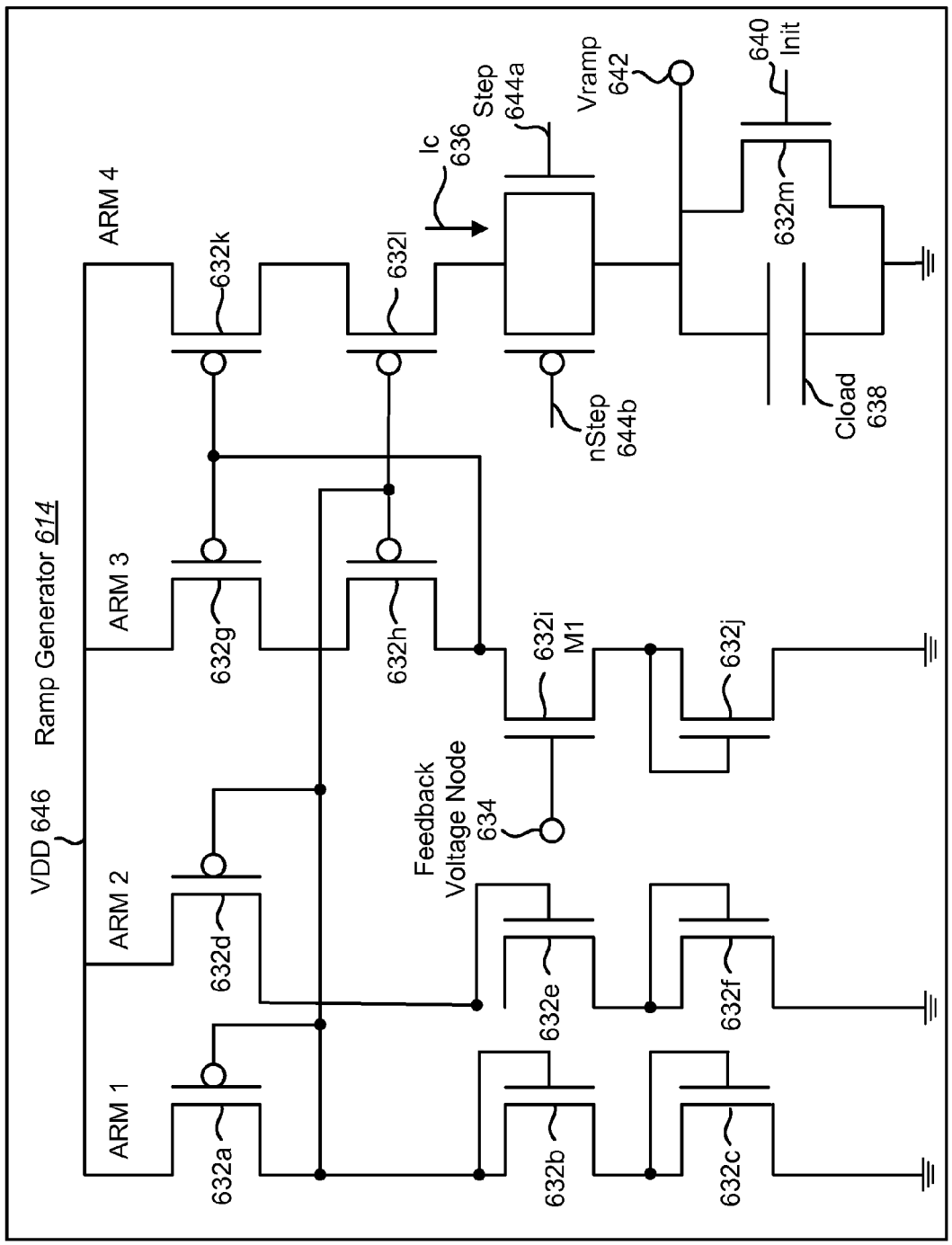
FIG. 6 is a circuit diagram illustrating one configuration of a ramp generator for use in the present methods and apparatus.

FIG. 6 is a circuit diagram illustrating one configuration of a ramp generator 614 for use in the present systems and methods. The ramp generator 614 may be connected to a supply voltage, VDD 646. The ramp generator 614 may include a constant current source. A constant current source providing a current i may provide a current value between "i+error_margin" to "i-error_margin", where "error_margin" and "i" can be application specific and can lie in any numerical range, depending on the application. The constant current source may be implemented using multiple transistors 632a-m arranged in a fashion to produce a constant current 636, as shown in the circuit diagram of FIG. 6. A current mirror circuit using semi-telescopic topology may produce the constant current 636. The constant current 636 may then be applied to a capacitor $C_{load}$ 638. In one configuration, $C_{load}$ 638 may be a 10 picoFarad (pF) capacitor. The voltage across $C_{load}$ 638 may be referred to as $V_{ramp}$ 642. The voltage across $C_{load}$ 638 may increase linearly as the constant current 636 charges $C_{load}$ 638. An initialization signal Init 640 may be provided to the ramp generator 614 to initiate production testing 112 of an ADC 108 on the same chip as the ramp generator 614. The voltage across $C_{load}$ 638 may be applied as an input to the ADC 108.

The ramp generator 614 may receive feedback 211 from a feedback circuit 216. The gate bias for transistor M1 632i may depend on the feedback circuit 216. For example, the gate of transistor M1 632i may be set to the feedback voltage node 634. An increase in the feedback voltage node 634 may decrease the constant current 636 of the ramp generator 614. A decrease in the constant current 636 of the ramp generator 614 may increase the charging time of the capacitor $C_{load}$ 638. Likewise, a decrease in the feedback voltage node 634 may increase the constant current 636 of the ramp generator 614 and decrease the charging time of the capacitor $C_{load}$ 638. The charging time of the capacitor $C_{load}$ 638 may also be referred to as the settling time of the ramp generator 614. The settling time for the ramp generator 614 may be a factor in production testing 112 because testing of the ADC 108 may not begin until a consistent ramp slope has been obtained. Therefore, it may be desirable for the output ramp to stabilize in the minimal possible time. The ramp generator 614 may receive Step 644a and nStep 644b. Step 644a and nStep 644b may be fed the system differential clock in order to enable conduction of the constant current to Cload 638. Step 644a and nStep 644b may prevent Cload 638 from charging during a reset phase when Cload 638 is shorted using Init 640 with transistor 640m. This prevents a short circuit and excessive current flow through Cload 638.

Figure 7:
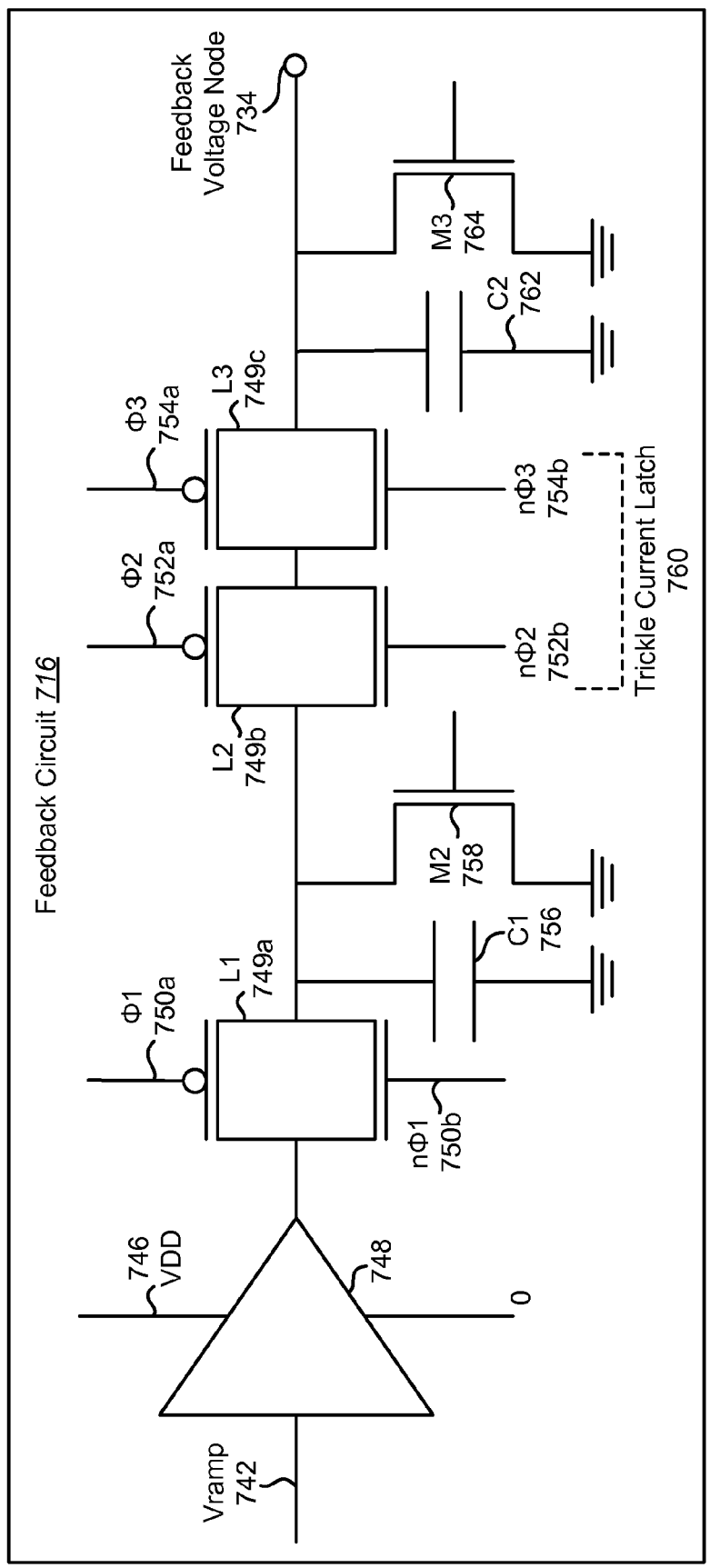
FIG. 7 is a circuit diagram illustrating one configuration of a feedback circuit for use in the present methods and apparatus.

FIG. 7 is a circuit diagram illustrating one configuration of a feedback circuit 716 for use in the present systems and methods. The input of the feedback circuit 716 may be tied to the output $V_{ramp}$ 742 of the ramp generator 614. A clocked comparator 748 may be used to compare the ramp output $V_{ramp}$ 742 with VDD/2 at the time Tper/2, where Tper is the ramp period.

Transistor M2 758 may be used to reset capacitor C1 756. Capacitor C1 756 may be used as a per-cycle-charge-storage for the clocked comparator 748 output. If $V_{ramp}$ 742 is less than VDD/2 at Tper/2, the voltage across C1 756 may be set to VDD 746. Otherwise, the voltage across C1 756 may be set to 0 volts. The feedback circuit may also include multiple latches L1 749a, L2 749b and L3 749c. Latch L1 749a may be controlled with a clocking resource that has phases φ1 750a and nφ1 750b. Latch L2 749b may be controlled with a clocking resource that has phases φ2 752a and nφ2 752b. Latch L3 749c may be controlled with a clocking resource that has phases φ3 754a and nφ3 754b. Latches L2 749b and L3 749c may be referred to as a combination latch or a trickle current latch 760. Latches L2 749b and L3 749c may be toggled by an offset clock to limit the conductive phase of the combination latch such that the offset phase φ3 754a is given by Equation (5):

$$\phi 3 = \phi 1 \cap \phi 2. \quad (5)$$

Phase φ2 752a and φ3 754a may be generated by using a single clocking resource—the phase difference generated by adding wide-gate delay. Phase φ3 754a lags phase φ2 752a by this delay amount. This phase offset limits the effective conduction cycle through this dual-latch as explained in Equation (5). The offset phase φ2 752a may be generated out of an oversized gate delay such that no clocking source overhead is required. When L2 749b and L3 749c conduct, C1 756 is connected in parallel with a second capacitor C2 762, and a charge sharing current flows to equalize the voltage across each capacitor according to Equation (6):

$$I\ charge-sharing = \frac{d}{dt}\left[\frac{v_1 - v_2}{c_1 + c_2}\right]. \quad (6)$$

The voltage across capacitor C2 762 may be used to change the bias current in the constant current source of the ramp generator 614 because the voltage across capacitor C2 762 is the feedback voltage node 634,734 applied to the gate of transistor M1 632i from FIG. 6 above. The voltage across capacitor C2 762 may also be referred to as $V_{ramp}$. If $V_{ramp}$ is less than a reference voltage $V_{ref}$ in the clocked comparator 748 at Tper/2, C1 756 may charge C2 762 to a higher voltage value. If $V_{ramp}$ is greater than $V_{ref}$ at Tper/2, the voltage across C1 756 may be set to 0 volts, and C1 756 may partially discharge C2 762, lowering the effective voltage across C2 762. A reduction in voltage across C2 762 means a lower gate bias for the current mirror used in the constant current source of FIG. 6, thereby reducing the load charging current 636.

C1 756 and C2 762 may each be designed to be approximately 1 picoFarad (pF) to minimize the layout area overhead. Using wide transistors for the latches L2 749b and L3 749c may enable rapid charge sharing between C1 756 and C2 762 due to increased conductivity. Using wide transistors for the latches L2 749b and L3 749c may also result in $V_{ramp}$ overshoot and undershoot, as excessive correction bias may be applied to the constant current source of the ramp generator 614. The transistor widths for the latches L2 749b and L3 749c may be optimized to stabilize $V_{ramp}$ in approximately 6-7 cycles. The reference voltage $V_{ref}$ in the clocked comparator 748 may typically be maintained at VDD/2 and may be generated on the integrated circuit 106 by matched load sharing. Transistor M3 764 may provide a reset option for the feedback biasing voltage when the circuit is initialized.

Figure 8:
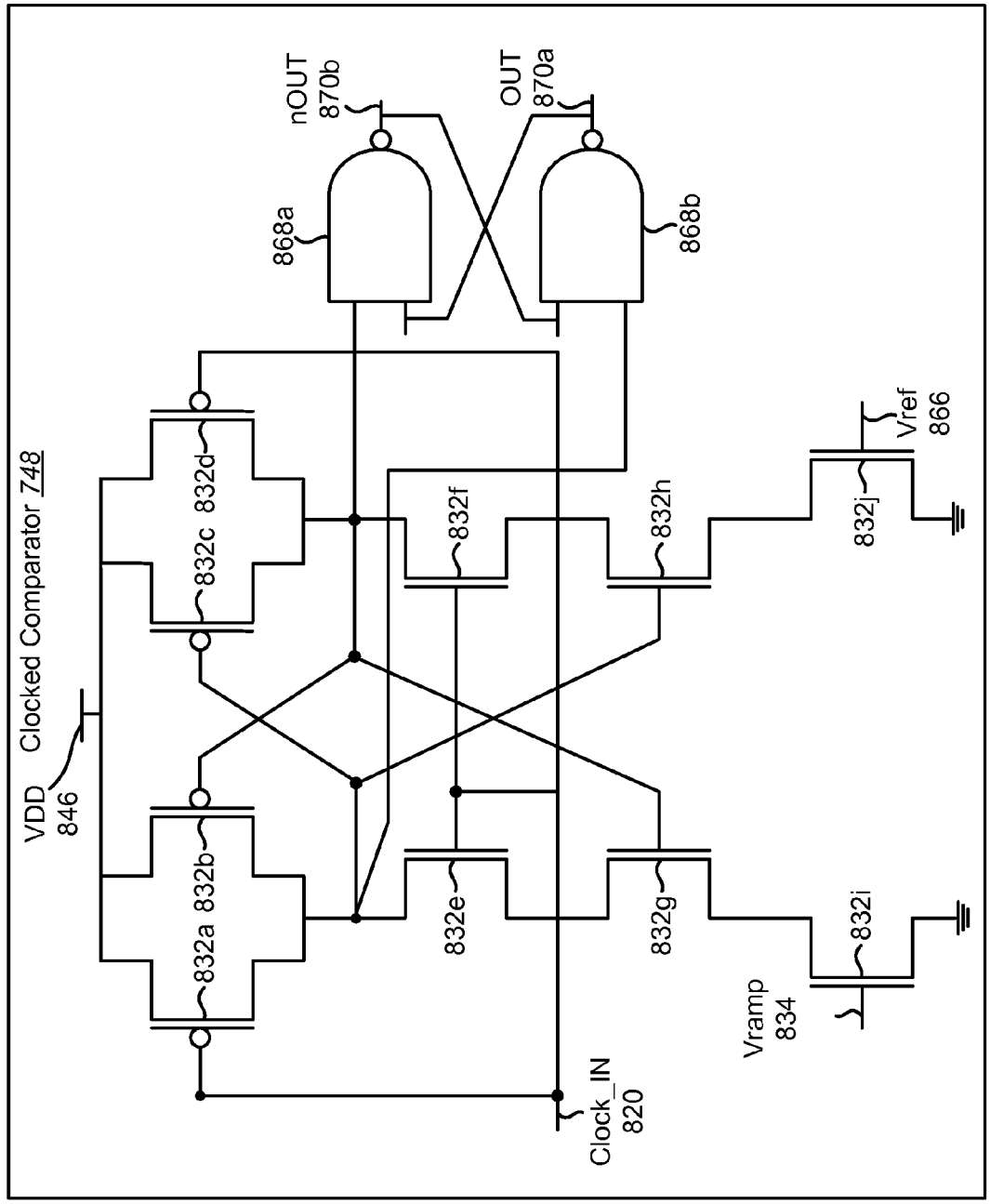
FIG. 8 is a circuit diagram illustrating one configuration of a clocked comparator for use in the present methods and apparatus.

FIG. 8 is a circuit diagram illustrating one configuration of a clocked comparator 748 for use in the present systems and methods. The clocked comparator 748 may be used as part of the feedback circuit 216. The clocked comparator 748 may include multiple transistors 832a-j connected between VDD 846 and ground, along with two NAND gates 868a, 868b, as shown in FIG. 8. The clocked comparator 748 may use a Clock_IN 820 to control two of the transistors 832a, 832d.

The clocked comparator 748 may receive $V_{ramp}$ 834 as the gate voltage to transistor 832i. The clocked comparator may also receive $V_{Ref}$ 866 as the gate voltage to transistor 832j. As discussed above in relation to FIG. 7, the clocked comparator 748 may output 870a a voltage VDD 846 if $V_{ramp}$ 834 is less than VDD/2 at Tper/2. Otherwise, the clocked comparator 748 may output 870a a voltage of 0 volts. Outputs 870a and 870b are mutually inverted and either of the two may be used in the feedback path, depending on the application. The remaining output may remain unused.

Figure 9:
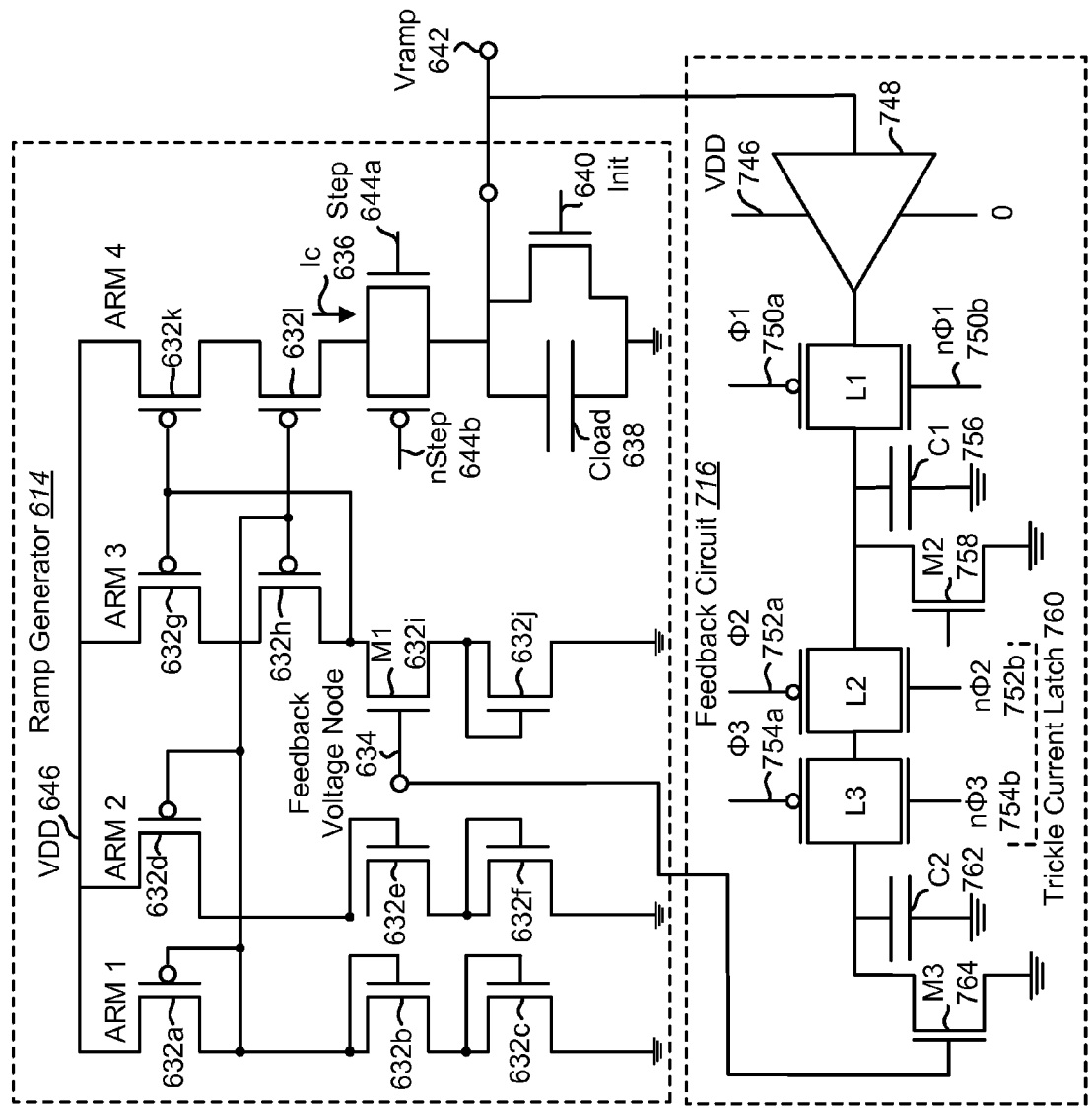
FIG. 9 is a circuit diagram illustrating one configuration of BiST of ADCs with low-cost ATE compatibility.

FIG. 9 is a circuit diagram illustrating one configuration of BiST of ADCs 108 with low-cost ATE 102 compatibility. The output $V_{ramp}$ 642 of a ramp generator 614 may be input to a feedback circuit 716. The output 634 of the feedback circuit 716 may be input to the gate of transistor M1 632i of the ramp generator 614, thereby influencing the current source and ramp time of the ramp generator 614. FIG. 9 is a circuit diagram illustrating how the circuits of FIGS. 6 and 7 may be interconnected.

Figure 10:
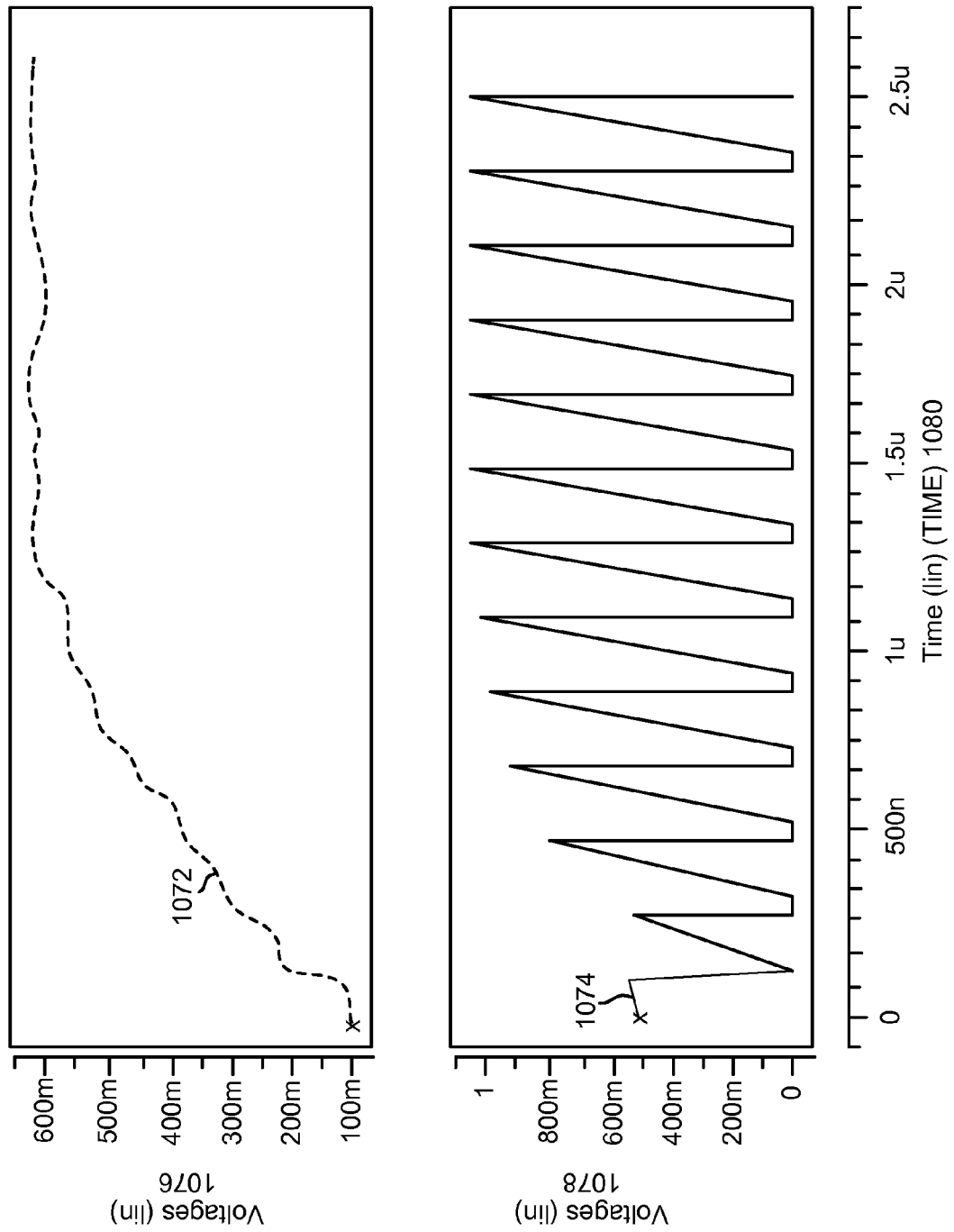
FIG. 10 is a graph illustrating the stabilization of a ramp generator with feedback.

FIG. 10 is a graph illustrating the stabilization of a ramp generator 214 with feedback. The output voltage 1076 of the ramp generator 214 $V_{ramp}$ 1072 is shown over time 1080. The time 1080 scale of FIG. 10 shows microsecond values (e.g., 1 u=1 microsecond). $V_{ramp}$ 1072 may increase to $V_{max}$ (approximately 600 millivolts in the example of FIG. 10) over a period of time. For example, $V_{ramp}$ 1072 may approach $V_{max}$ after 6-7 cycles. $V_{ramp}$ 1072 may approach linearity while maintaining the proper slope. The output voltage 1078 of the feedback circuit 216 feedback voltage node 1074 is also shown over time 1080. The feedback voltage node 1074 may switch between 0 volts and VDD (approximately one volt in the example of FIG. 10) to maintain the linearity and proper slope of $V_{ramp}$ 1072.

Figure 11:
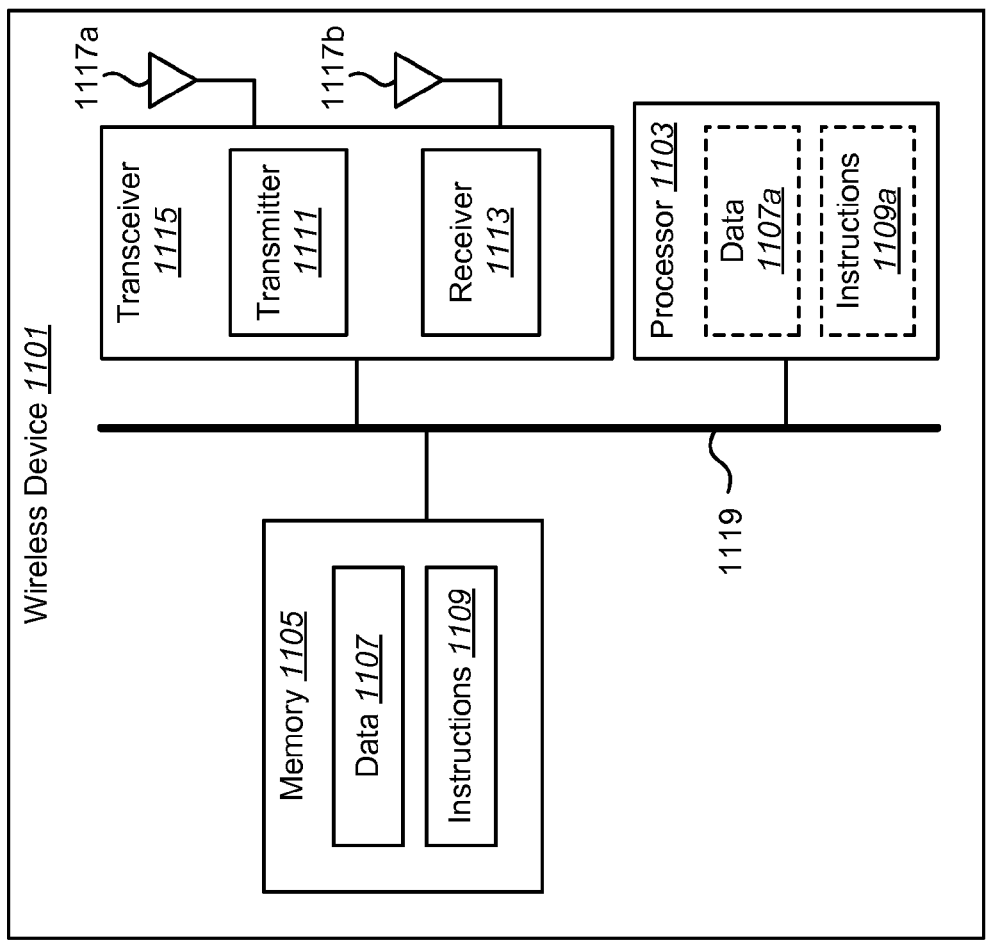
FIG. 11 is a block diagram illustrating certain components that may be included within a wireless device that is configured in accordance with the present disclosure.

FIG. 11 illustrates certain components that may be included within a wireless device 1101. The wireless device 1101 may be a mobile device/station or a base station. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1101. Additionally, the present systems and methods may be used on an integrated circuit 106 that may be an electronic device that is not a wireless device 1101. However, the electronic device block diagram and components would be similar to the wireless device 1101 of FIG. 11 except that the electronic device may not have a transceiver 1115.

The wireless device 1101 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the wireless device 1101 of FIG. 11, in an alternative configuration, a combination of processors (e.g., an ARM and DSP) could be used.

The wireless device 1101 also includes memory 1105. The memory 1105 may be any electronic component capable of storing electronic information. The memory 1105 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1107 and instructions 1109 may be stored in the memory 1105. The instructions 1109 may be executable by the processor 1103 to implement the methods disclosed herein. Executing the instructions 1109 may involve the use of the data 1107 that is stored in the memory 1105. When the processor 1103 executes the instructions 1107, various portions of the instructions 1109a may be loaded onto the processor 1103, and various pieces of data 1107a may be loaded onto the processor 1103.

The wireless device 1101 may also include a transmitter 1111 and a receiver 1113 to allow transmission and reception of signals to and from the wireless device 1101. The transmitter 1111 and receiver 1113 may be collectively referred to as a transceiver 1115. An antenna 1117 may be electrically coupled to the transceiver 1115. The wireless device 1101 may also include (not shown) multiple transmitters, multiple receivers, multiple transceivers and/or multiple antenna (e.g., 1117a, 1117b).

The various components of the wireless device 1101 may be coupled together by one or more buses, which may include a power bus, a control signal bus, a status signal bus, a data bus, etc. For the sake of clarity, the various buses are illustrated in FIG. 11 as a bus system 1119.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 4 and 5, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. An integrated circuit configured for built in self test (BiST) of analog-to-digital convertors (ADCs), comprising:
   an ADC;
   a ramp generator, wherein the ramp generator provides a voltage ramp to the ADC;
   feedback circuitry for the ramp generator, wherein the feedback circuitry maintains a constant ramp slope for the ramp generator; and
   an interval counter, wherein the interval counter provides a timing reference, and wherein the interval counter and the ramp generator share clocking resources.

2. The integrated circuit of claim 1, wherein the ADC, the ramp generator, the feedback circuitry and the interval counter share the clocking resources.

3. The integrated circuit of claim 1, wherein the voltage ramp increases linearly.

4. The integrated circuit of claim 1, wherein the feedback circuitry adjusts a gate bias for a transistor in the ramp generator to provide a linearly increasing voltage ramp.

5. The integrated circuit of claim 1, wherein outputs from the ADC are provided to output pads for observation by automatic test equipment (ATE) using a simple functional pattern.

6. The integrated circuit of claim 1, wherein the ramp generator comprises a current source applied to a capacitor.

7. The integrated circuit of claim 1, wherein the feedback circuitry comprises a clocked comparator.

8. The integrated circuit of claim 7, wherein the clocked comparator outputs a supply voltage if the voltage ramp is less than half the supply voltage at half the ramp period.

9. The integrated circuit of claim 7, wherein the clocked comparator outputs a voltage of zero volts if the voltage ramp is greater than half the supply voltage at half the ramp period.

10. The integrated circuit of claim 1, further comprising a multiplexer, wherein the multiplexer switches an input for the ADC between operational analog inputs and the voltage ramp.

11. The integrated circuit of claim 1, wherein the ADC, the ramp generator, the feedback circuitry and the interval counter are capable of using phase-shifted limited duty cycle clocks.

12. The integrated circuit of claim 1, wherein the interval counter is scannable and the output is shifted out serially for production testing by automatic test equipment (ATE).

13. The integrated circuit of claim 1, wherein the interval counter receives outputs from the ADC.

14. The integrated circuit of claim 1, wherein the timing reference is provided to external automatic test equipment (ATE).

15. A method for built in self test (BiST) of analog-to-digital convertors (ADCs), comprising:
    generating a constant current;
    providing a voltage ramp by a ramp generator;
    providing feedback to the ramp generator; and
    applying the voltage ramp from the ramp generator to an ADC, wherein the ramp generator and the ADC share clocking resources.

16. The method of claim 15, wherein the ADC, the ramp generator and feedback circuitry providing the feedback share the clocking resources.

17. The method of claim 15, wherein the voltage ramp increases linearly.

18. The method of claim 16, wherein the feedback circuitry adjusts a gate bias for a transistor in the ramp generator to provide a linearly increasing voltage ramp.

19. The method of claim 15, further comprising providing outputs from the ADC to output pads for observation by automatic test equipment (ATE) using a simple functional pattern.

20. The method of claim 15, wherein the ramp generator comprises a current source applied to a capacitor.

21. The method of claim 16, wherein the feedback circuitry comprises a clocked comparator.

22. The method of claim 21, wherein the clocked comparator outputs a supply voltage if the voltage ramp is less than half the supply voltage at half the ramp period.

23. The method of claim 21, wherein the clocked comparator outputs a voltage of zero volts if the voltage ramp is greater than half the supply voltage at half the ramp period.

24. The method of claim 15, further comprising switching an input for the ADC between operational analog inputs and the voltage ramp.

25. The method of claim 15, wherein the ADC, the ramp generator and feedback circuitry providing the feedback are capable of using phase-shifted limited duty cycle clocks.

26. A wireless device configured for built in self test (BiST) of analog-to-digital convertors (ADCs), comprising:
a processor;
memory in electronic communication with the processor;
a transceiver; and
circuitry including:
an ADC;
a ramp generator, wherein the ramp generator provides a voltage ramp to the ADC;
feedback circuitry for the ramp generator, wherein the feedback circuitry maintains a constant ramp slope for the ramp generator; and
an interval counter, wherein the interval counter provides a timing reference.

27. The wireless device of claim 26, wherein the ADC, the ramp generator, the feedback circuitry and the interval counter share clocking resources.

28. The wireless device of claim 26, wherein the voltage ramp increases linearly.

29. The wireless device of claim 26, wherein the feedback circuitry adjusts a gate bias for a transistor in the ramp generator to provide a linearly increasing voltage ramp.

30. The wireless device of claim 26, wherein the ramp generator comprises a current source applied to a capacitor.

31. The wireless device of claim 26, wherein the feedback circuitry comprises a clocked comparator.

32. The wireless device of claim 31, wherein the clocked comparator outputs a supply voltage if the voltage ramp is less than half the supply voltage at half the ramp period.

33. The wireless device of claim 31, wherein the clocked comparator outputs a voltage of zero volts if the voltage ramp is greater than half the supply voltage at half the ramp period.

34. The wireless device of claim 26, further comprising a multiplexer, wherein the multiplexer switches an input for the ADC between operational analog inputs and the voltage ramp.

35. The wireless device of claim 26, wherein the ADC, the ramp generator, the feedback circuitry and the interval counter are capable of using phase-shifted limited duty cycle clocks.

36. The wireless device of claim 26, wherein the interval counter is scannable and the output is shifted out serially for production testing by automatic test equipment (ATE).

37. The wireless device of claim 26, wherein the interval counter receives outputs from the ADC.

38. The wireless device of claim 26, wherein the timing reference is provided to external automatic test equipment (ATE).

39. An apparatus for built in self test (BiST) of analog-to-digital convertors (ADCs), comprising:
means for generating a constant current;
means for providing a voltage ramp by a ramp generator;
means for providing feedback to the ramp generator; and
means for applying the voltage ramp from the ramp generator to an ADC, wherein the ramp generator and the ADC share clocking resources.

40. A computer-program product for a wireless device configured for built in self test (BiST) of analog-to-digital convertors (ADCs), the computer-program product comprising a computer-readable medium having instructions thereon, the instructions comprising:
code for generating a constant current;
code for providing a voltage ramp by a ramp generator;
code for providing feedback to the ramp generator; and
code for applying the voltage ramp from the ramp generator to an ADC, wherein the ramp generator and the ADC share clocking resources.

* * * * *